(12) United States Patent
Wu et al.

(10) Patent No.: US 10,748,861 B2
(45) Date of Patent: Aug. 18, 2020

(54) PACKAGE STRUCTURE AND MANUFACTURING METHOD THEREOF

(71) Applicant: Taiwan Semiconductor Manufacturing Co., Ltd., Hsinchu (TW)

(72) Inventors: Kai-Chiang Wu, Hsinchu (TW); Han-Ping Pu, Taichung (TW); Yen-Ping Wang, Changhua County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/980,764

(22) Filed: May 16, 2018

(65) Prior Publication Data

US 2019/0355679 A1 Nov. 21, 2019

(51) Int. Cl.
| | |
|---|---|
| H01L 25/11 | (2006.01) |
| H01L 25/10 | (2006.01) |
| H01L 23/66 | (2006.01) |
| H01L 23/498 | (2006.01) |
| H01L 23/544 | (2006.01) |
| H01L 21/56 | (2006.01) |
| H01L 23/31 | (2006.01) |

(52) U.S. Cl.
CPC ............ *H01L 23/66* (2013.01); *H01L 21/561* (2013.01); *H01L 23/3135* (2013.01); *H01L 23/49827* (2013.01); *H01L 23/49838* (2013.01); *H01L 23/544* (2013.01); *H01L 2223/54426* (2013.01); *H01L 2223/6616* (2013.01); *H01L 2223/6677* (2013.01)

(58) Field of Classification Search
None
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |

(Continued)

*Primary Examiner* — Grant S Withers
(74) *Attorney, Agent, or Firm* — JCIPRNET

(57) ABSTRACT

A package structure includes a chip package and an antenna package. The chip package includes at least one semiconductor die and a first insulating encapsulation encapsulating the at least one semiconductor die. The antenna package is located on and electrically coupled to the chip package. The antenna package includes metallic patterns embedded in a second insulating encapsulation, wherein each of the metallic patterns has a first surface, a second surface opposite to the first surface and a side surface connecting the first surface and the second surface, wherein the first surface and the side surface of each of the metallic patterns are covered by the second insulating encapsulation, and the second surface is levelled and coplanar with a third surface of the second insulating encapsulation.

17 Claims, 12 Drawing Sheets

(56) References Cited

U.S. PATENT DOCUMENTS

| | | | | |
|---|---|---|---|---|
| 10,157,834 | B1* | 12/2018 | Tang | H01L 23/528 |
| 2006/0279003 | A1* | 12/2006 | Maruyama | H01L 22/32 |
| | | | | 257/797 |
| 2012/0217645 | A1* | 8/2012 | Pagaila | H01L 21/486 |
| | | | | 257/774 |
| 2014/0124916 | A1* | 5/2014 | Yu | H01L 23/3128 |
| | | | | 257/737 |
| 2018/0269139 | A1* | 9/2018 | Chiang | H01L 23/49838 |
| 2018/0315715 | A1* | 11/2018 | Chiu | H01L 21/568 |
| 2019/0035749 | A1* | 1/2019 | Dalmia | H01Q 1/2283 |
| 2019/0067001 | A1* | 2/2019 | Chen | H01L 21/78 |
| 2019/0319347 | A1* | 10/2019 | Fang | H01L 23/66 |

\* cited by examiner

US 10,748,861 B2

PACKAGE STRUCTURE AND MANUFACTURING METHOD THEREOF

BACKGROUND

Semiconductor devices and integrated circuits are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
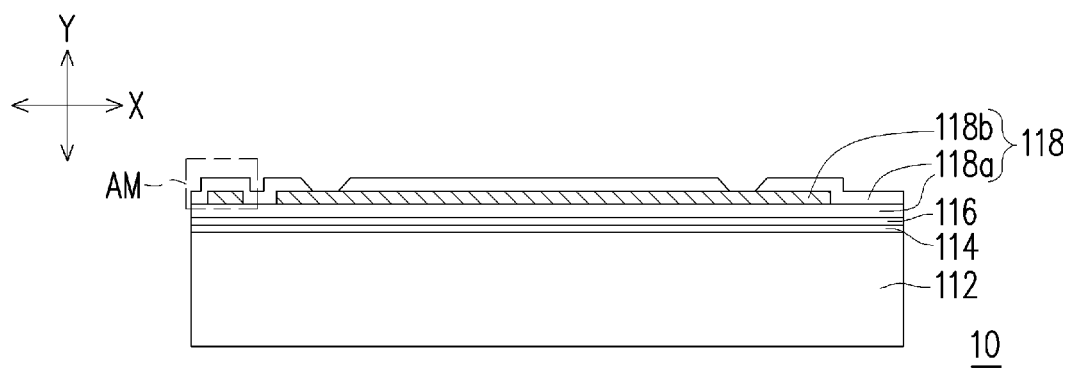
FIG. 1 to FIG. 9 are schematic cross sectional views of various stages in a manufacturing method of a package structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 11A:
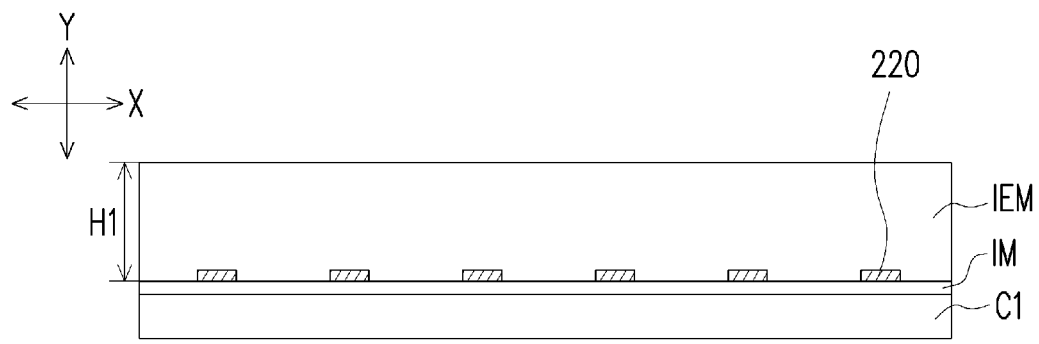
FIG. 11A to FIG. 11C are schematic cross sectional views of various stages in a manufacturing method of an antenna package in accordance with some embodiments of the disclosure.
Figure 11B:
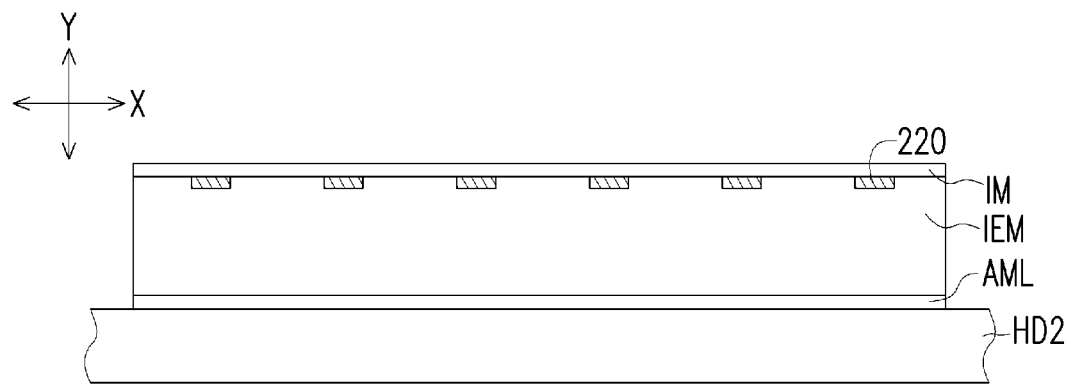
Figure 11C:
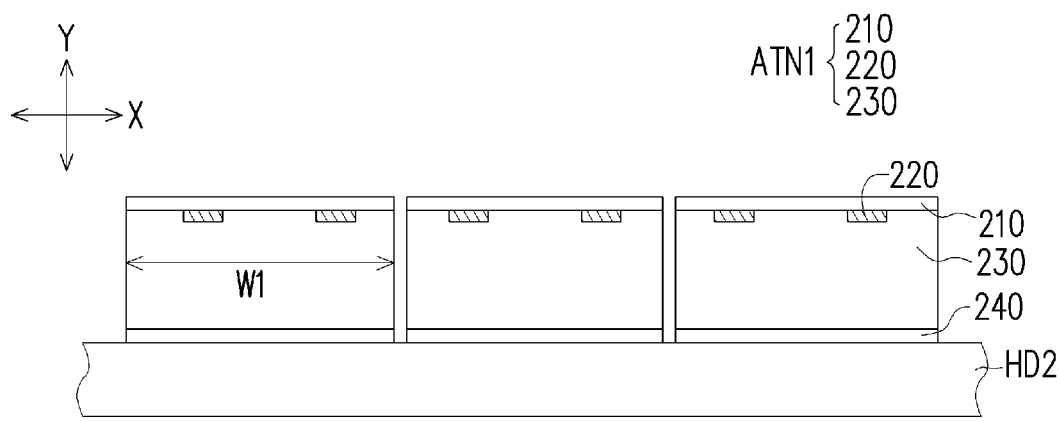

FIG. 1 to FIG. 9 are schematic cross sectional views of various stages in a manufacturing method of a package structure in accordance with some embodiments of the disclosure. FIG. 11A to FIG. 11C are schematic cross sectional views of various stages in a manufacturing method of an antenna package in accordance with some embodiments of the disclosure. FIG. 15A to FIG. 15E are schematic top views illustrating various predetermined patterns of an alignment mark in accordance with some embodiments of the disclosure. In FIG. 1 to FIG. 9, one (semiconductor) chip or die is shown to represent plural (semiconductor) chips or dies of the wafer, and a package structure 10 is shown to represent a package structure obtained following the manufacturing method, for example. In other embodiments, two (semiconductor) chips or dies are shown to represent plural (semiconductor) chips or dies of the wafer, and one or more package structures are shown to represent plural (semiconductor) package structures obtained following the (semiconductor) manufacturing method, the disclosure is not limited thereto.

Referring to FIG. 1, in some embodiments, a carrier 112 with a debond layer 114 and a buffer layer 116 coated thereon is provided. In one embodiment, the carrier 112 may be a glass carrier or any suitable carrier for carrying a semiconductor wafer or a reconstituted wafer for the manufacturing method of the semiconductor package.

In some embodiments, the debond layer 114 is disposed on the carrier 112, and the material of the debond layer 114 may be any material suitable for bonding and debonding the carrier 112 from the above layer(s) (e.g., the buffer layer 116) or any wafer(s) disposed thereon. In some embodiments, the debond layer 114 may include a release layer (such as a light-to-heat conversion ("LTHC") layer) or an adhesive layer (such as an ultra-violet curable adhesive or a heat curable adhesive layer).

In some embodiments, the buffer layer 116 is disposed on the debond layer 114, and the debond layer 114 is located between the carrier 112 and the buffer layer 116, as shown in FIG. 1. In some embodiments, the buffer layer 116 may be a dielectric material layer. In some embodiments, the buffer layer 116 may be a polymer layer which made of polyimide, polybenzoxazole (PBO), benzocyclobutene (BCB), or any other suitable polymer-based dielectric material. In some embodiments, the buffer layer 116 may be Ajinomoto Buildup Film (ABF), Solder Resist film (SR), or the like. The top surface of the buffer layer 116 may be levelled and may have a high degree of coplanarity. However, the disclosure is not limited thereto; in an alternative embodiment, the buffer layer is optional and may be omitted.

Continued on FIG. 1, in some embodiments, a redistribution circuit structure 118 is formed over the carrier 112. For example, in FIG. 1, the redistribution circuit structure 118 is formed on the buffer layer 116, and the formation of the redistribution circuit structure 118 includes sequentially forming one or more dielectric layers 118a and one or more metallization layers 118b in alternation. In some embodiments, the redistribution circuit structure 118 includes two dielectric layers 118a and one metallization layer 118b as shown in FIG. 1, where the metallization layer 118b is sandwiched between the dielectric layers 118a, and portions of a top surface of the metallization layer 118b are respectively exposed by the openings of a topmost layer of the dielectric layers 118a. However, the disclosure is not limited thereto. The numbers of the metallization layers and the dielectric layers included in the redistribution circuit structure 118 is not limited thereto, and may be designated and selected based on the demand. For example, the numbers of the metallization layers and the dielectric layers may be one or more than one.

In certain embodiments, the material of the dielectric layers 118a may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 118a formed by suitable fabrication techniques such as spin-on coating, chemical vapor deposition (CVD), plasma-enhanced chemical vapor deposition (PECVD) or the like. The disclosure is not limited thereto.

In some embodiments, the material of the metallization layer 118b may be made of conductive materials formed by electroplating or deposition, such as aluminum, titanium, copper, nickel, tungsten, and/or alloys thereof, which may be patterned using a photolithography and etching process. In some embodiments, the metallization layer 118b may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

As shown in FIG. 1, in some embodiments, at least one alignment mark AM is formed in the metallization layer 118b of the redistribution circuit structure 118. For example, the alignment mark AM is patterned to have a predetermined target pattern including a solid plate with at least one slit (opening). For example, in FIG. 15A to FIG. 15E, the alignment mark AM may have a predetermined target pattern including a solid plate 51 with at least one slit 52, where the slit 52 may be in a form of a cross-shape (see FIG. 15A), a circular-shape (see FIG. 15B), a L-shape (see FIG. 15C), a rectangular-shape (see FIG. 15D), a triangular-shape (see FIG. 15E), or combinations thereof. However, the disclosure is not limited thereto. Due to the alignment mark AM, an accuracy of alignment of disposing a later-formed components) (e.g. an antenna component) thereon can be ensured.

Figure 2:
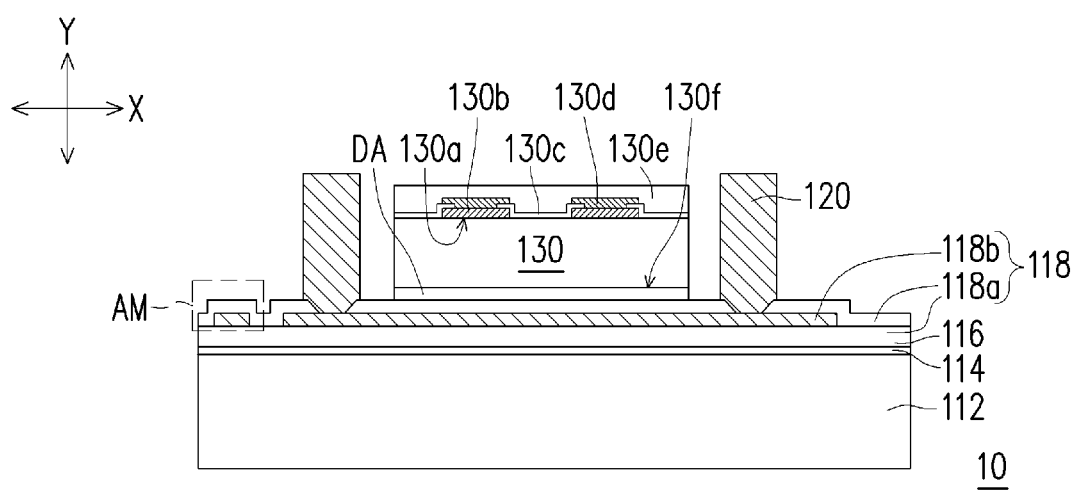

Referring to FIG. 2, in some embodiments, through vias 120 are formed on the redistribution circuit structure 118. In some embodiments, the through vias 120 may be through integrated fan-out (InFO) vias. For simplification, only two through vias 120 are presented in FIG. 2 for illustrative purposes, however it should be noted that more than two through vias may be formed; the disclosure is not limited thereto. The number of the through vias 120 can be selected based on the demand.

In some embodiments, the through vias 120 are formed by photolithography, plating, photoresist stripping processes or any other suitable method. In one embodiment, the through vias 120 may be formed by forming a mask pattern (not shown) covering the redistribution circuit structure 118 with openings exposing the top surface of the metallization layer 118b exposed by the topmost layer of the dielectric layers 118a, forming a metallic material filling the openings to form the through vias 120 by electroplating or deposition and then removing the mask pattern. In one embodiment, the material of the through vias 120 may include a metal material such as copper or copper alloys, or the like. However, the disclosure is not limited thereto.

Continued on FIG. 2, in some embodiments, at least one semiconductor die 130 with a connecting film DA disposed thereon is provided, where the semiconductor die 130 has an active surface 130a and a backside surface 130f opposite to the active surface 130a. As shown in FIG. 2, the semiconductor die 130 is disposed on the redistribution circuit structure 118 and over the carrier 112 through the connecting film DA. In some embodiments, the connecting film DA is located between the semiconductor die 130 and the redistribution circuit structure 118, and the connecting film DA is physically contacts the backside surface 130f of the semiconductor die 130 and the redistribution circuit structure 118 (e.g. the topmost layer of the dielectric layers 118a of the redistribution circuit structure 118). In some embodiments, due to the connecting film DA provided between the semiconductor die 130 and the redistribution circuit structure 118, the semiconductor die 130 and the redistribution circuit structure 118 are stably adhered to each other. In some embodiments, the connecting film DA may be, for example, a semiconductor die attach film, a layer made of adhesives or epoxy resin, or the like. In some embodiments, the redistribution circuit structure 118 is referred as a back-side redistribution layer of the semiconductor die 130.

As shown in FIG. 2, for example, the through vias 120 are located aside of a location of the semiconductor die 130, and are mechanically and electrically connected to the metallization layer 118b of the redistribution circuit structure 118. In FIG. 2, a height of the through vias 120 is greater than a height of the at least one semiconductor die 130, for example; however, the disclosure is not limited thereto. In an alternative embodiment, the height of the through vias 120 may be less than or substantially equal to the height of the at least one semiconductor die 130. In one embodiment, the through vias 120 may be formed prior to the formation of the semiconductor die 130. In an alternative embodiment, the through vias 120 may be formed after the formation of the semiconductor die 130. The disclosure is not limited to the disclosure.

In some embodiments, as shown in FIG. 2, the semiconductor die 130 includes the active surface 130a, a plurality of pads 130b distributed on the active surface 130a, a passivation layer 130c covering the active surface 130a and a portion of the pad 130b, a plurality of conductive pillars 130d connected to the portion of the pads 130b, a protection layer 130e covering the pads 130b and the conductive pillars 130d, and the backside surface 130f opposite to the active surface 130a. The pads 130b are partially exposed by the passivation layer 130c, the conductive pillars 130d are disposed on and electrically connected to the pads 130b, and the protection layer 130e covers the passivation layer 130c and the conductive pillars 130d.

In some embodiments, the pads 130b may be aluminum pads or other suitable metal pads. In some embodiments, the conductive pillars 130d are copper pillars, copper alloy pillar or other suitable metal pillars, for example. In some embodiments, the passivation layer 130c and/or the protection layer 130e may be a polybenzoxazole (PBO) layer, a polyimide (PI) layer or other suitable polymers. In some alternative embodiments, the passivation layer 130c and/or the protection layer 130e may be made of inorganic materials, such as silicon oxide, silicon nitride, silicon oxynitride, or any suitable dielectric material. In certain embodiments, the materials of the passivation layer 130c and the protection layer 130e may be the same or different, the disclosure is not limited thereto.

In an alternative embodiment, the semiconductor die 130 may include the pads 130b distributed on the active surface 130a, the passivation layer 130c covering the active surface 130a and a portion of the pad 130b, the backside surface 130f opposite to the active surface 130a. The disclosure is not limited thereto.

As shown in FIG. 2, only one semiconductor die is presented for illustrative purposes, however it should be noted that one or more semiconductor dies may be provided. In some embodiments, the semiconductor die 130 described herein may be referred as a chip or an integrated circuit (IC). In some embodiments, the semiconductor die 130 includes at least one wireless and radio frequency (RF) chip. In some embodiments, the semiconductor die 130 may further include additional chip(s) of the same type or different types. For example, in an alternative embodiment, more than one semiconductor die 130 are provided, and the semiconductor dies 130, except for including at least one wireless and RF chip, may include the same or different types of chips selected from digital chips, analog chips or mixed signal chips, application-specific integrated circuit ("ASIC") chips, sensor chips, memory chips, logic chips or voltage regulator chips. In an alternative embodiment, the semiconductor die 130 may be referred as a chip or a IC of combination-type, and the semiconductor die 130 may be a WiFi chip simultaneously including both of a RF chip and a digital chip. The disclosure is not limited thereto.

Figure 3:
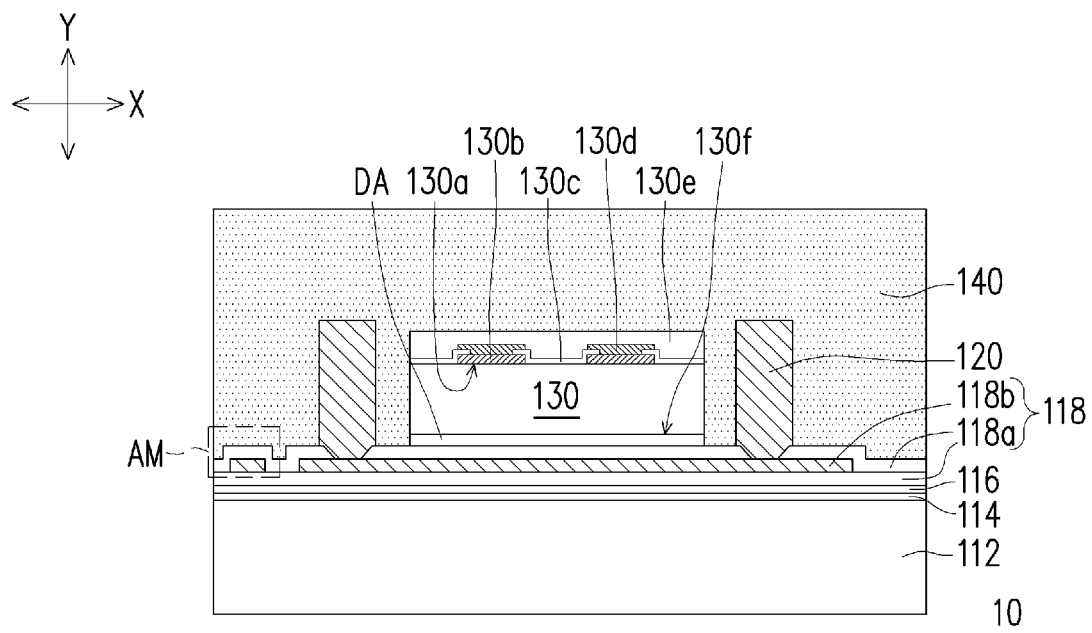

Referring to FIG. 3, in some embodiments, the through vias 120 and the semiconductor die 130 are encapsulated in an insulating encapsulation 140. In some embodiments, the insulating encapsulation 140 is formed on the redistribution circuit structure 118 and over the carrier 112. As shown in FIG. 3, the insulating encapsulation 140 at least fills up the gaps between the through vias 120 and between the through vias 120, the semiconductor die 130 and the connecting film DA. In some embodiments, the insulating encapsulation 140 covers the redistribution circuit structure 118 and the connecting film DA. In certain embodiments, as shown in FIG. 3, the through vias 120 and the semiconductor die 130 are not accessibly revealed by the insulating encapsulation 140.

Figure 4:
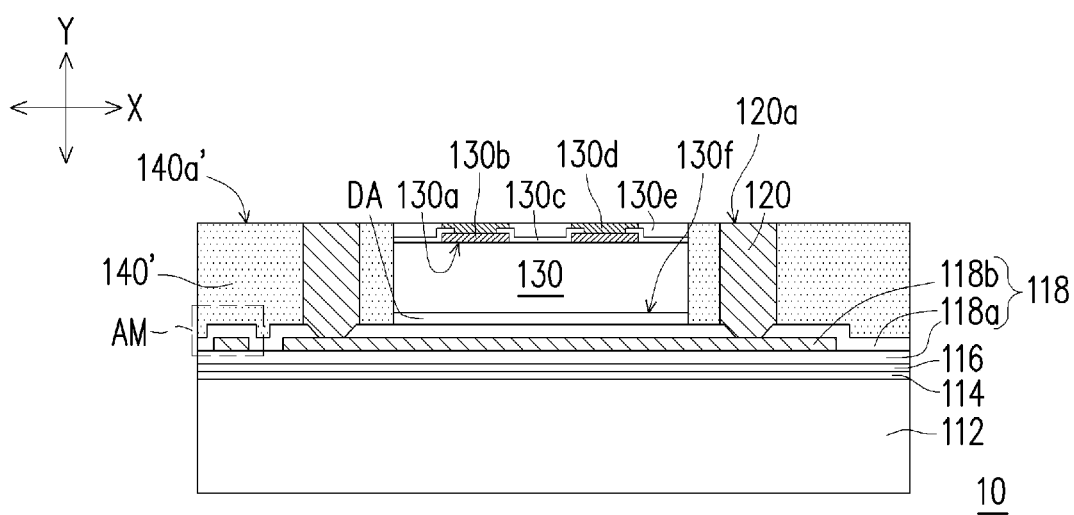

Continued on FIG. 3, in some embodiments, the insulating encapsulation 140 covers the redistribution circuit structure 118 exposed from the through vias 120 and the semiconductor die 130. In some embodiments, the insulating encapsulation 140 is a molding compound formed by a molding process. In some embodiments, the insulating encapsulation 140, for example, may include polymers (such as epoxy resins, phenolic resins, silicon-containing resins, or other suitable resins), dielectric materials having low permittivity (Dk, where low Dk<4) and low loss tangent (Df, where low Df≤$10^{-3}$) properties, or other suitable materials. In an alternative embodiment, the insulating encapsulation 140 may include an acceptable insulating encapsulation material. In some embodiments, the insulating encapsulation 140 may further include inorganic filler or inorganic compound (e.g. silica, clay, and so on) which can be added therein to optimize coefficient of thermal expansion (CTE) of the insulating encapsulation 140. The disclosure is not limited thereto Referring to FIG. 4, in some embodiments, the insulating encapsulation 140 is planarized to form an insulating encapsulation 140' exposing the through vias 120 and the semiconductor die 130. In certain embodiments, as shown in FIG. 4, after the planarization, top surfaces 120a of the through vias 120 and top surfaces of the conductive pillars 130d and the protection layer 130e (of the semiconductor die 130) are exposed by a top surface 140a' of the insulating encapsulation 140'. That is, for example, the top surfaces of the conductive pillars 130d and the protection layer 130e of the semiconductor die 130 and the top surfaces 120a of the through vias 120 become substantially leveled with the top surface 140a' of the insulating encapsulation 140'. In other words, the top surfaces of the conductive pillars 130d and the protection layer 130e of the semiconductor die 130, the top surfaces 120a of the through vias 120, and the top surface 140a' of the insulating encapsulation 140' are substantially coplanar to each other.

The insulating encapsulation 140 may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 140, the conductive pillars 130d and the protection layer 130e of the semiconductor die 130 and the through vias 120 may also be planarized. In certain embodiments, the planarizing step may, for example, performed on the over-molded insulating encapsulation 140 to level the top surface 140a' of the insulating encapsulation 140', the top surfaces 120a of the through vias 120, and the top surfaces of the conductive pillars 130d and the protection layer 130e of the semiconductor die 130.

Figure 5:
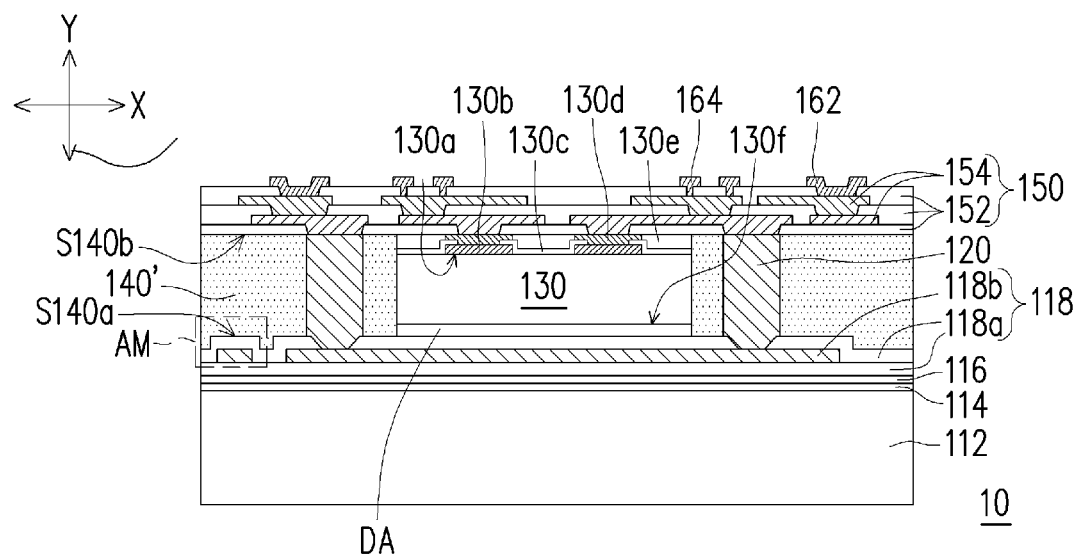

Referring to FIG. 5, in some embodiments, a redistribution circuit structure 150 is formed on the through vias 120, the semiconductor die 130 and the insulating encapsulation 140'. As shown in FIG. 5, the redistribution circuit structure 150 is formed on the top surfaces 120a of the through vias 120, the top surfaces of the conductive pillars 130d and the protection layer 130e of the semiconductor die 130 and the top surface 140a' of the insulating encapsulation 140'. In some embodiments, the redistribution circuit structure 150 is electrically connected to the through vias 120, and is electrically connected to the semiconductor die 130 through the conductive pillars 130d. In some embodiments, through the redistribution circuit structure 150, the semiconductor die 130 is electrically connected to the through vias 120. In some embodiments, through the redistribution circuit structure 150 and the through vias 120, the semiconductor die 130 is electrically connected to the redistribution circuit structure 118. As shown in FIG. 5, for example, the redistribution circuit structure 150 is referred as a front-side redistribution layer of the semiconductor die 130. In some embodiments, as shown in FIG. 5, the semiconductor die 130 is directly located between the redistribution circuit structure 150 and the connecting film DA, where the through vias 120 and the insulating encapsulation 140' are directly located between the redistribution circuit structure 150 and the redistribution circuit structure 118. In other words, the redistribution circuit structure 118 and the redistribution circuit structure 150 are located at two opposite sides of the insulating encapsulation 140', where the redistribution circuit structure 118 is disposed on a side S140a of the insulating encapsulation 140' and the redistribution circuit structure 150 is disposed on a side S140b of the insulating encapsulation 140'.

In some embodiments, the formation of the redistribution circuit structure 150 includes sequentially forming one or more dielectric layers 152 and one or more metallization layers 154 in alternation. In certain embodiments, as shown in FIG. 5, the metallization layers 154 are sandwiched between the dielectric layers 152, where the top surface of a topmost layer of the metallization layers 154 is exposed by a topmost layer of the dielectric layers 152 and the bottom surface of a bottommost layer of the metallization layers 154 is exposed by a bottommost layer of the dielectric layers 152 to mechanically and electrically connect the through vias 120 and the conductive pillars 130d of the semiconductor die 130.

In some embodiments, the formation of the dielectric layers 152 may be the same as the formation of the dielectric layers 118as, and the formation of the metallization layers 154 may be the same as the formation of the metallization layer 118b, thus is not repeated herein. In an alternative embodiment, the material of the dielectric layers 152 may be the same as or different from the material of the dielectric layers 118a. In an alternative embodiment, the material of the metallization layers 154 may be the same as or different from the material of the metallization layer 118b. The disclosure is not limited thereto. It should be noted that the redistribution circuit structure 150 is not limited to include three dielectric layers and/or two metallization layers. For example, the numbers of the metallization layers and the dielectric layers may be one or more than two. As shown in FIG. 5, in some embodiments, the redistribution circuit structure 118 and the redistribution circuit structure 150 provide a routing function for the semiconductor die 130.

Continued on FIG. 5, in some embodiments, a plurality of under-ball metallurgy (UBM) patterns 162 may be disposed on the exposed top surface of the topmost layer of the metallization layers 154 for electrically connecting with conductive elements (e.g. conductive balls), and/or at least one connection pad 164 may be disposed on the exposed top surface of the topmost layer of the metallization layers 154 for electrically connecting with at least one semiconductor elements (e.g., passive components or active components). As shown in FIG. 5, for example, the UBM patterns 162 and the connection pads 164 are formed on and electrically connected to the redistribution circuit structure 150. In some embodiments, the materials of the UBM patterns 162 and the connection pads 164 may include copper, nickel, titanium, tungsten, or alloys thereof or the like, and may be formed by an electroplating process, for example. In one embodiment, the material of the UBM patterns 162 may be the same as that of the connection pads 164. In another embodiment, the material of the UBM patterns 162 may be different from that of the connection pads 164. In one embodiment, there may be only the UBM patterns 162 presented in the package structure; however, in an alternative embodiment, there may be only the connection pads 164. The numbers of the UBM patterns 162 and the connection pad 164 are not limited in this disclosure, and may be selected based on the design layout.

Figure 6:
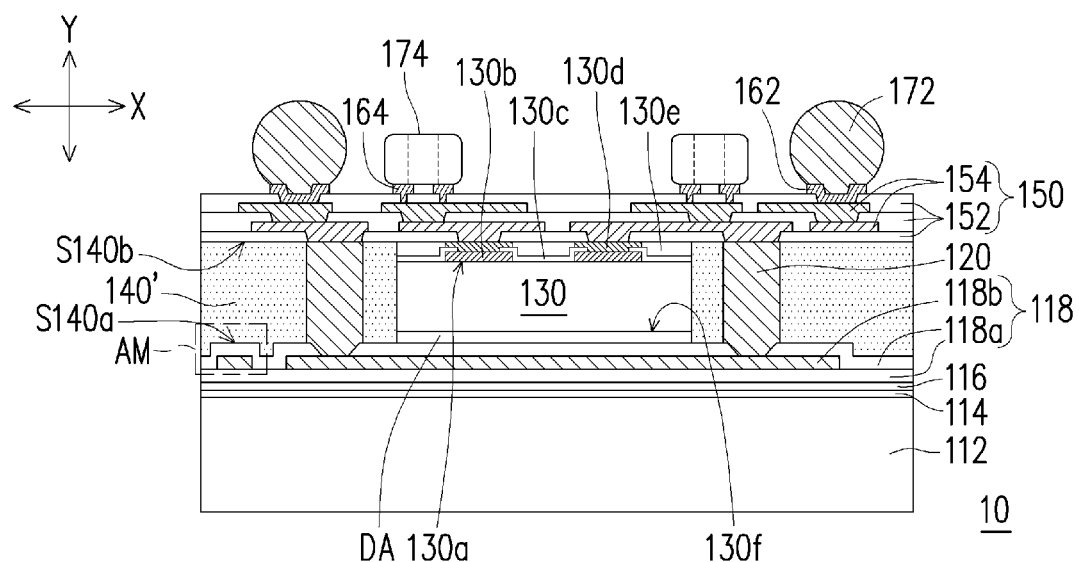

Referring to FIG. 6, in some embodiments, after the redistribution circuit structure 150 is formed, a plurality of conductive elements 172 are formed on the redistribution circuit structure 150. As shown in FIG. 6, the conductive elements 172 are disposed on the UBM patterns 162 over the redistribution circuit structure 150. In some embodiments, the conductive elements 172 may be disposed on the UBM patterns 162 by ball placement process or reflow process. In some embodiments, the conductive elements 172 are, for example, solder balls or ball grid array (BGA) balls. In some embodiments, the conductive elements 172 are connected to the redistribution circuit structure 150 through the UBM patterns 162. As shown in the FIG. 6, some of the conductive elements 172 are electrically connected to the semiconductor die 130 through the UBM patterns 162 and the redistribution circuit structure 150; some of the conductive elements 172 are electrically connected to the through vias 120 through the UBM patterns 162 and the redistribution circuit structure 150; and some of the conductive elements 172 are electrically connected to the redistribution circuit structure 118 through the UBM patterns 162, the redistribution circuit structure 150, and the through vias 120. The number of the conductive elements 172 is not limited to the disclosure, and may be designated and selected based on the number of the UBM patterns 162.

Continued on FIG. 6, in some embodiments, at least one semiconductor die 174 is provided and disposed on the redistribution circuit structure 150. As shown in FIG. 6, the semiconductor die 174 is disposed on the connection pads 164, and is connected to the redistribution circuit structure 150 through the connection pads 164. In some embodiments, the semiconductor die 174 may be disposed on the connection pads 164 through reflow process. In some embodiments, the conductive elements 172 and the semiconductor die 174 are formed on a surface of the redistribution circuit structure 150, wherein the redistribution circuit structure 150 is located between the insulating encapsulation 140' and the conductive elements 172 and between the insulating encapsulation 140' and the semiconductor die 174. In some embodiments, as shown in FIG. 6, the semiconductor die 174 includes a surface mount device (e.g. a passive device, such as, capacitors, resistors, inductors, combinations thereof, or the like). The number of the semiconductor die 174 can be selected based on the number of the connection pad 164. In an alternative embodiment, the semiconductor die 174 may include surface mount devices of the same type or different types, the disclosure is not limited thereto. In alternative embodiments, the semiconductor die 174 are optional, and may be omitted.

Figure 7:
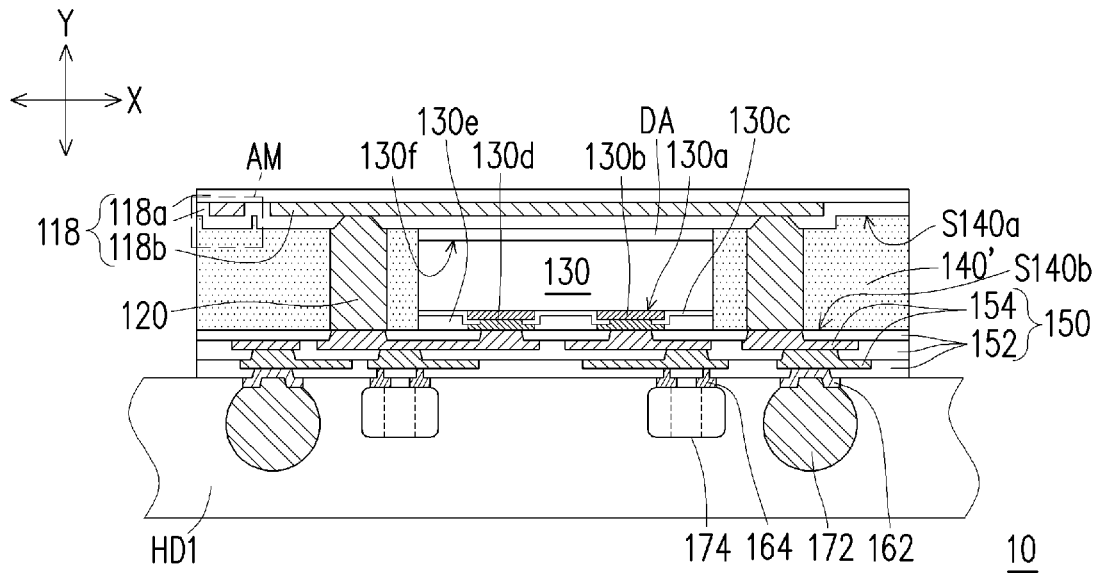

Referring to FIG. 7, in some embodiments, the whole package structure 10 along with the carrier 112 is flipped (turned upside down), where the conductive elements 172 and the semiconductor die 174 are placed to a holding device HD1, and the carrier 112 is then debonded from the buffer layer 116. In some embodiments, the holding device HD1 includes a polymer film, and the conductive elements 172 and the semiconductor die 174 are mounted into the polymer film as shown in FIG. 7. For example, the material of the polymer film may include a polymer film having sufficient elasticity to allow the conductive elements 172 and the semiconductor die 174 being embedded therein. In certain embodiments, the holding device HD1 may be a parafilm or a film made of other suitable soft polymer materials or the like. In an alternative embodiment, the holding device HD1 may be an adhesive tape, a carrier film or a suction pad. The disclosure is not limited thereto.

Continued on FIG. 7, in some embodiments, the buffer layer 116 is easily separated from the carrier 112 due to the debond layer 114. In some embodiments, the carrier 112 is detached from the buffer layer 116 through a debonding process, and the carrier 112 and the debond layer 114 are removed. In certain embodiments, the buffer layer 116 is exposed, as show in FIG. 7. In one embodiment, the debonding process is a laser debonding process. During the debonding step, the holding device HD1 is used to secure the package structures 10 before debonding the carrier 112 and the debond layer 114. In an alternative embodiment, the buffer layer 116 may be removed from the redistribution circuit structure 118 after debonding the carrier 112 and the debond layer 114. In the disclosure, the redistribution circuit structure 118, the through vias 120, the semiconductor die 130, the insulating encapsulation 140', the redistribution circuit structure 150, the UBM patterns 162, the conductive elements 172, and the semiconductor die 174 may be referred to as a chip package CP.

Figure 8:
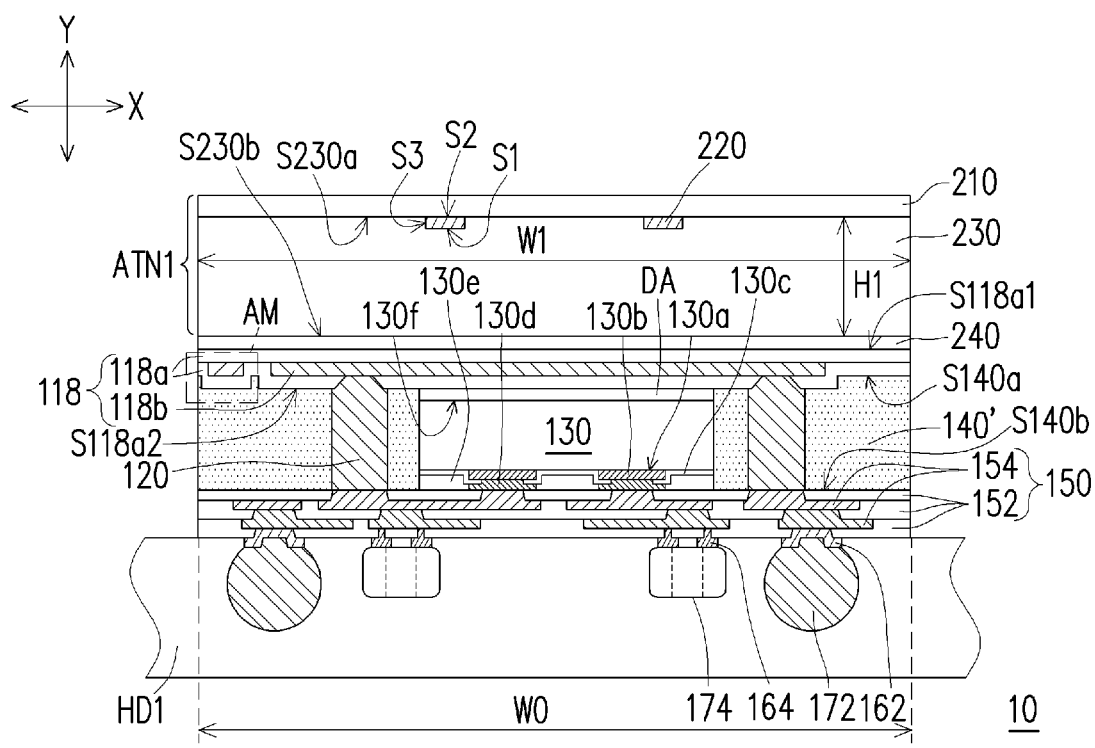

Referring to FIG. 8, in some embodiments, an antenna package ATN1 is provided and disposed on the redistribution circuit structure 118 (e.g. a side S118a1 of the redistribution circuit structure 118). In certain embodiments, an alignment between the antenna package ATN1 and the chip package CP can be easily achieved by using an optical microscope (e.g. a detection of an intensity of light reflection of the alignment mark AM). In some embodiments, the antenna package ATN1 is disposed on the redistribution circuit structure 118 through a connecting film 240. In some embodiments, due to the connecting film 240 provided between the redistribution circuit structure 118 and the antenna package ATN1, the antenna package ATN1 and the redistribution circuit structure 118 are stably adhered to each other. In some embodiments, the connecting film 240 may be, for example, a semiconductor die attach film, a layer made of adhesives or epoxy resin, or the like.

For example, as shown in FIG. 8, the connecting film 240 is located between the antenna package ATN1 and the redistribution circuit structure 118, the redistribution circuit structure 118 is located between the insulating encapsulation 140' and the connecting film 240, the insulating encapsulation 140' is located between the redistribution circuit structure 118 and the redistribution circuit structure 150, and the redistribution circuit structure 150 is located between the insulating encapsulation 140' and conductive elements 172. In some embodiments, a side S118a1 of the redistribution circuit structure 118 physically contact to the connecting film 240, and a side S118a2 of the redistribution circuit structure 118 physically contact to the insulating encapsulation 140'.

For example, the antenna package ATN1 includes a protection layer 210, metallic patterns 220 and an insulating encapsulation 230, where the metallic patterns 220 are disposed on and distributed over the protection layer 210, and the insulating encapsulation 230 encapsulates the metallic patterns 220 and covers the protection layer 210 exposed by the metallic patterns 220. As shown in FIG. 8, in some embodiments, the antenna package ATN1 is disposed on the redistribution circuit structure 118 by adhering a side S230b of the insulating encapsulation 230 to the side S118a1 of the redistribution circuit structure 118 through the connecting film 240. That is, the insulating encapsulation 140' and the insulating encapsulation 230 are respectively located at two opposite sides of the redistribution circuit structure 118; or saying, the insulating encapsulation 140' and the insulating encapsulation 230 are respectively located at two opposite sides of the connecting film 240.

In some embodiments, the material of the protection layer 210 may include polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be formed by suitable fabrication techniques such as deposition, spin-on coating, chemical vapor deposition (CVD), plasma-enhanced chemical vapor deposition (PECVD) or the like. The disclosure is not limited thereto.

In some embodiments, each of the metallic patterns 220 has a surface S1, a surface S2 opposite to the surface S1, and a sidewall S3 connecting the surface S1 and the surface S2, wherein the surface S2 of each of the metallic patterns 220 physically contacts the protection layer 210, and the surface S1 and the sidewall S3 of each of the metallic patterns 220 physically contacts the insulating encapsulation 230. For example, as shown in FIG. 8, for each metallic pattern 220, the metallic pattern 220 is embedded in the insulating encapsulation 230, where the surface S2 is accessibly revealed by a side S230a of the insulating encapsulation 230, and the surface S1 and the sidewall S3 are covered by the insulating encapsulation 230. In some embodiments, the insulating encapsulation 230 is located between the protection layer 210 and the connecting film 240, and the metallic patterns 220 are located between the protection layer 210 and the insulating encapsulation 230.

In certain embodiments, the metallic patterns 220 are arranged in a matrix form on the protection layer 210 within the positioning location of the semiconductor die 130, such as the N×N array or N×M arrays (N, M>0, N may or may not be equal to M). The size of the array for the metallic patterns 220 can be designated and selected based on the demand, and is not limited to the disclosure. In some embodiments, the material of the metallic patterns 220 includes aluminum, titanium, copper, nickel, tungsten, and/ or alloys thereof. In certain embodiments, in a top view, the shapes of the metallic patterns 220 may be square, round, elliptical, oval, tetragonal, octagonal or any suitable polygonal shape. The disclosure is not limited thereto. In some embodiments, the metallic patterns 220 are electrically coupled to a portion of the redistribution circuit structure 118, where the portion of the redistribution circuit structure 118 serves as the ground plate and the feed line of the antenna package ATN1. In some embodiments, the antenna package ATN1 may be referred to as patch antennas.

In some embodiments, on a direction Y (e.g. a stacking direction of the redistribution circuit structure 150, the insulating encapsulation 140', the redistribution circuit structure 118, and the insulating encapsulation 230), a height H1 of the insulating encapsulation 230 is greater than or substantially equal to 1000 μm and less than or substantially equal to 1500 μm. In some embodiments, the material and formation of the insulating encapsulation 230 may be the same or similar to the material and formation of the insulating encapsulation 140, thus may not be repeated herein. In certain embodiments, the material of the insulating encapsulation 230 has low permittivity (Dk) and low loss tangent (Df) properties. Depending on the frequency range of the high-speed applications, suitable materials of the insulating encapsulation 230 may be selected based on the required electrical properties of the package. Due to the use of the material having the low permittivity (Dk) and low loss tangent (Df) properties, higher gain of the antenna package ATN1 is obtained. In one embodiment, the material of the insulating encapsulation 230 and the material of the insulating encapsulation 140' may be the same. In an alternative embodiment, the material of the insulating encapsulation 230 can be different from the material of the insulating encapsulation 140', the disclosure is not limited thereto.

In some embodiments, the formation of the antenna package ATN1 may include the following steps illustrated in FIG. 11A to FIG. 11C, however the disclosure is not limited thereto. In FIG. 11A, a dielectric material layer IM is formed over a carrier C1 (similar to the carrier 112 depicted in FIG. 1) by lamination or the like, the metallic patterns 220 is formed on the dielectric material layer IM, and an insulating encapsulation material IEM is formed and encapsulates the metallic patterns 220, where a height H1 of the insulating encapsulation material IEM is greater than or substantially equal to 1000 μm and less than or substantially equal to 1500 μm. In FIG. 11B, the whole structure depicted in FIG. 11A is flipped (turned upside down), where the insulating encapsulation material IEM is placed onto a holding device HD2 (similar to the holding device HD1 depicted in FIG. 7) provided with an adhesive material layer AML, and the carrier C1 is then deboned from the dielectric material layer IM. In FIG. 11C, the dielectric material layer IM, the insulating encapsulation material IEM and the adhesive material layer AML are diced by mechanical sawing or the like to respectively form the protection layer 210, the insulating capsulation 230 and the connecting film 240; thereby forming a plurality of individual and separate antenna packages ATN1. In one embodiment, the metallic patterns 220 may formed by forming a conductive blanket layer over the protection layer 210 by electroplating or deposition over and then patterning the conductive blanket layer by photolithographic and etching processes. In an alternative embodiment, the metallic patterns 220 may formed by lamination or the like, the disclosure is not limited thereto.

Each of the antenna packages ATN1 is adhered to the connecting film 240 and includes the protection layer, the metallic patterns 220 and the insulating encapsulation 230. As shown in FIG. 11C, in some embodiments, each antenna package ATN1 has a width W1 which may be less than or substantially equal to a width W0 of the chip package CP. For example, as shown in FIG. 8, the width W1 of the antenna package ATN1 is substantially equal to a width W0 of the chip package CP, and a sidewall of the antenna package ATN1 is aligned with a sidewall of the chip package CP on the direction Y (e.g. the stacking direction of the antenna package ATN1 and the chip package CP).

Figure 9:
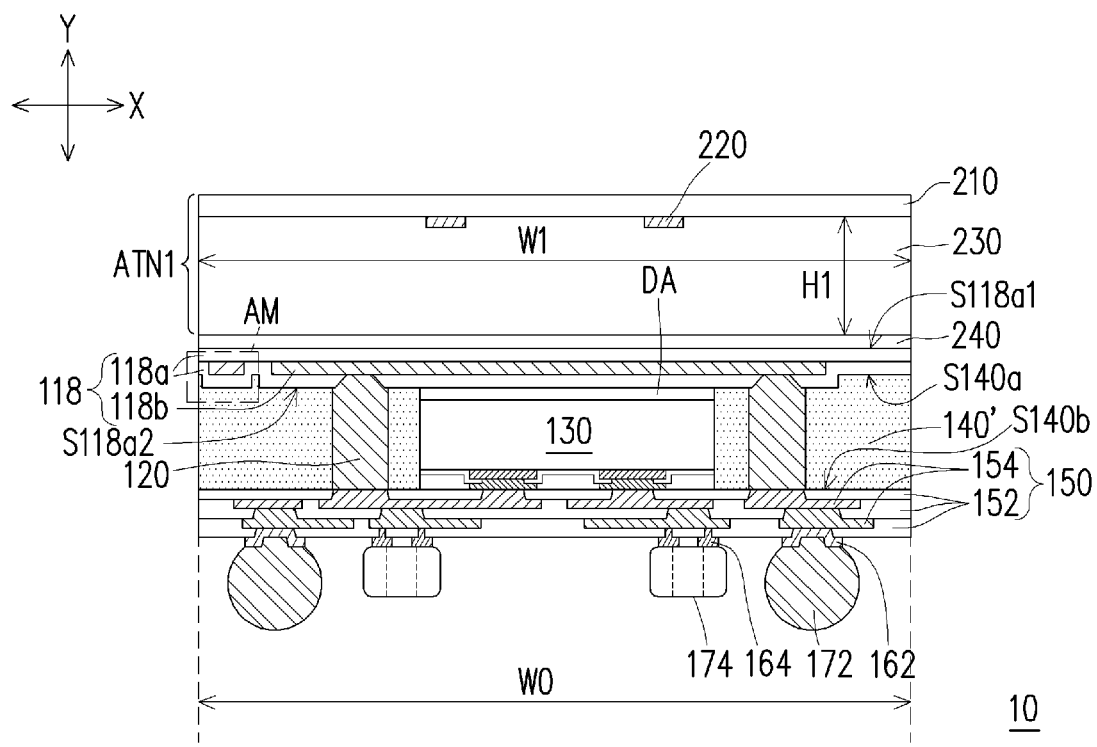

Referring to FIG. 9, in some embodiments, the conductive elements 172 and the semiconductor die 174 are released from the holding device HD1 to form the package structure 10, and the redistribution circuit structure 150, the conductive elements 172 and the semiconductor die 174 are exposed. In some embodiments, a dicing process is performed to cut the wafer having a plurality of the package structures 10 into individual and separated package structures 10 before releasing the conductive elements 172 and the semiconductor die 174 from the holding device HD1. In one embodiment, the dicing process is a wafer dicing process including mechanical blade sawing or laser cutting. Up to here, the manufacture of the package structure 10 is completed.

In some embodiments, the package structure 10 may be further mounted with an additional package, chips/dies or other electronic devices to form a stacked package structure. For example, the package structure 10 may be further mounted with an additional package, chips/dies or other electronic devices to form a package-on-package structure through the conductive elements 172 and/or other additional connectors based on the demand. The disclosure is not limited thereto.

Figure 10:
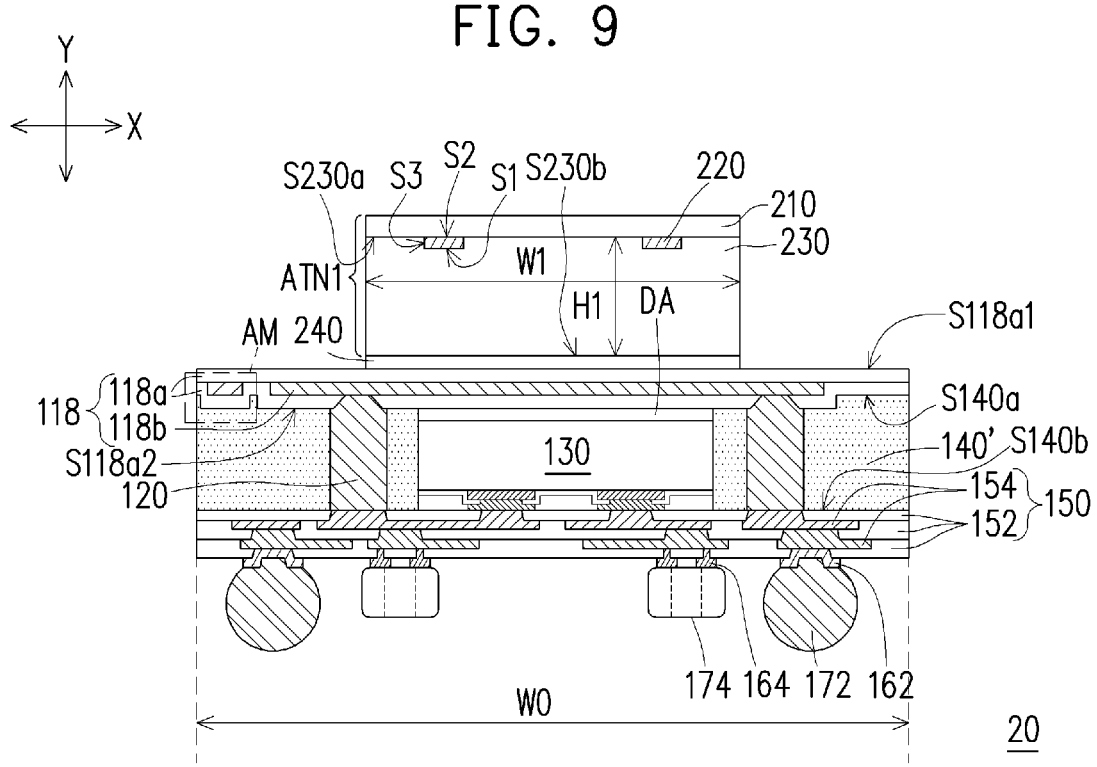
FIG. 10 is a schematic cross sectional view of a package structure in accordance with some embodiments of the disclosure.

FIG. 10 is a schematic cross sectional view of a package structure in accordance with some embodiments of the disclosure. Referring to FIG. 9 and FIG. 10, the package structure 10 depicted in FIG. 9 and the package structure 20 depicted in FIG. 10 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 9 and FIG. 10 together, the difference is that, for the package structure 20 depicted in FIG. 10, the width W1 of the antenna package ATN1 is less than a width W0 of the chip package CP. As shown in FIG. 10, a sidewall of the antenna package ATN1 is distant from a sidewall of the chip package CP on the direction X, where the direction X is perpendicular to the direction Y (e.g. the stacking direction of the antenna package ATN1 and the chip package CP).

Figure 12:
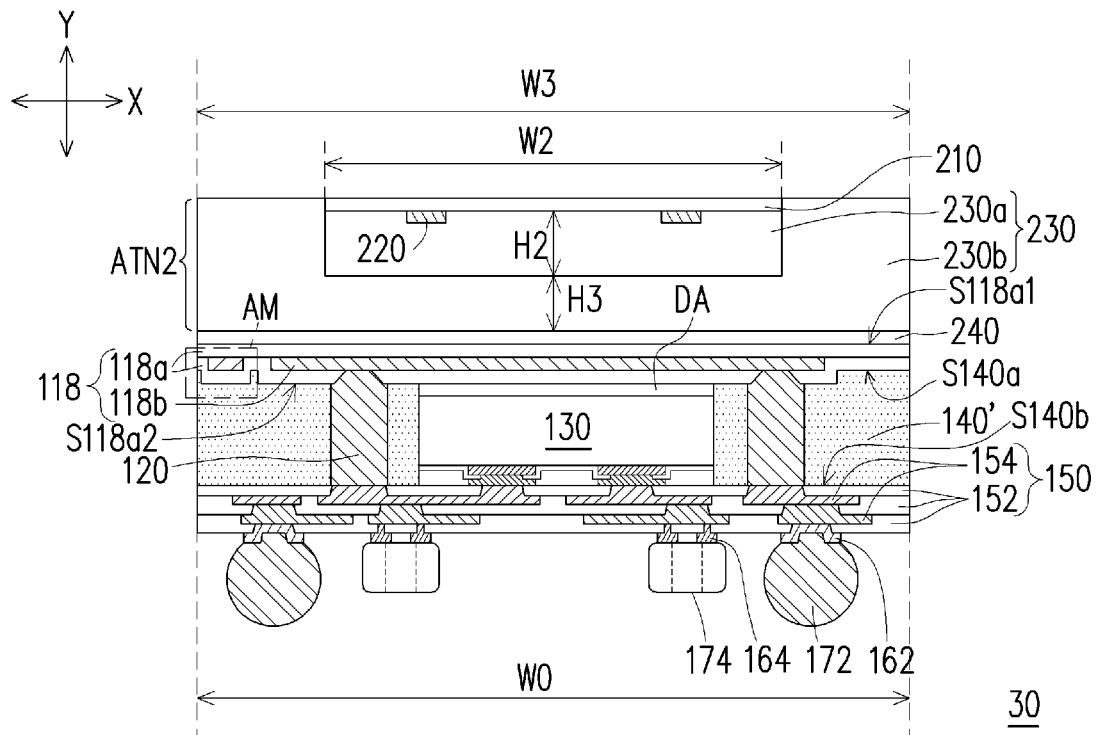
FIG. 12 is a schematic cross sectional view of a package structure in accordance with some embodiments of the disclosure.

FIG. 12 is a schematic cross sectional view of a package structure in accordance with some embodiments of the disclosure. FIG. 14A to FIG. 14E are schematic cross sectional views of various stages in a manufacturing method of an antenna package in accordance with some embodiments of the disclosure. Referring to FIG. 9 and FIG. 12, the package structure 10 depicted in FIG. 9 and the package structure 30 depicted in FIG. 12 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 9 and FIG. 10 together, the difference is that, for the package structure 30 depicted in FIG. 12, an antenna package ANT2 is replaced the antenna package ANT1 depicted in FIG. 9.

As shown in FIG. 12, in some embodiments, the antenna package ATN2 is disposed on the redistribution circuit structure 118 by adhering a side S230b of the insulating encapsulation 230b to the side S118a1 of the redistribution circuit structure 118 through the connecting film 240. That is, the insulating encapsulation 140' and the insulating encapsulation 230 are respectively located at two opposite sides of the redistribution circuit structure 118; or saying, the insulating encapsulation 140' and the insulating encapsulation 230 are respectively located at two opposite sides of the connecting film 240.

In certain embodiments, the antenna package ATN2 includes a protection layer 210, metallic patterns 220 and an insulating encapsulation 230, where the insulating encapsulation 230 includes an insulating encapsulation 230a and an insulating encapsulation 230b. In some embodiments, the metallic patterns 220 are disposed on and distributed over the protection layer 210, the insulating encapsulation 230a encapsulates the metallic patterns 220 and at least partially covers the protection layer 210 exposed by the metallic patterns 220, and the insulating encapsulation 230b encapsulates the insulating encapsulation 230a (where the insulating encapsulation 230b covers the side Sa and a sidewall SW of the insulating encapsulation 230a) and covers the protection layer 210 exposed by the insulating encapsulation 230a. In some embodiments, as shown in FIG. 12, the metallic patterns 220 is surrounded by the protection layer 210 and the insulating encapsulation 230a, and the encapsulation 230a is surrounded by the protection layer 210 and the insulating encapsulation 230b, where a portion of the protection layer 210 exposed by the metallic patterns 220 and the insulating encapsulation 230a covered by the insulating encapsulation 230b, and the protection layer 210 is in contact with the metallic patterns 220, the insulating encapsulation 230a and the insulating encapsulation 230b. The material of the insulating encapsulation 230b is, for example, the same or similar to the material of the insulating encapsulation 230a, thus may be not repeated herein. In some embodiments, the metallic patterns 220 are electrically coupled to a portion of the redistribution circuit structure 118, where the portion of the redistribution circuit structure 118 serves as the ground plate and the feed line of the antenna package ATN2. In some embodiments, the antenna package ATN2 may be referred to as patch antennas.

Figure 14A:
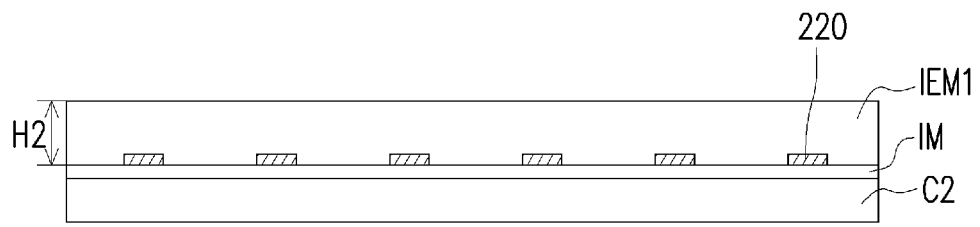
FIG. 14A to FIG. 14E are schematic cross sectional views of various stages in a manufacturing method of an antenna package in accordance with some embodiments of the disclosure.
Figure 14B:
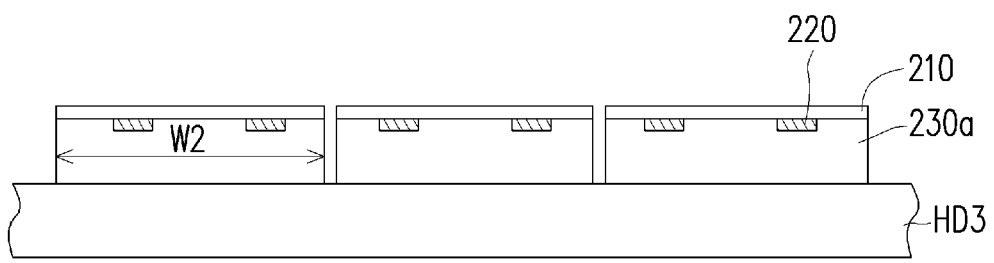
Figure 14C:
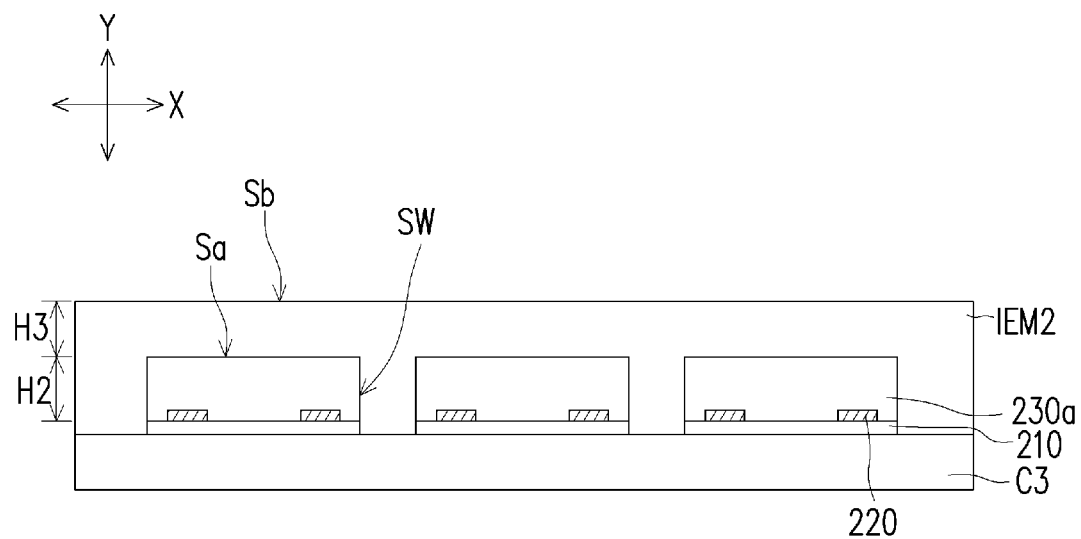

In some embodiments, a sum of a height H2 of the insulating encapsulation 230a and a height H3 of the insulating encapsulation 230b (where the height H3 is measured from a side Sa of the insulating encapsulation 230a to a side Sb of insulating encapsulation 230b as shown in FIG. 14C) is greater than or substantially equal to 1000 μm and less than or substantially equal to 1500 μm. In some embodiments, a width W3 of the insulating encapsulation 230b is less than or substantially equal to the width W0 of the chip package CP, and a width W2 of the insulating encapsulation 230a is less than or substantially equal to the width W3 of the insulating encapsulation 230b. For one example, as shown in FIG. 12, the width W2 of the insulating encapsulation 230a is less than the width W3 of the insulating encapsulation 230b, and the width W3 of the insulating encapsulation 230b is substantially equal to the width W0 of the chip package CP.

Figure 14D:
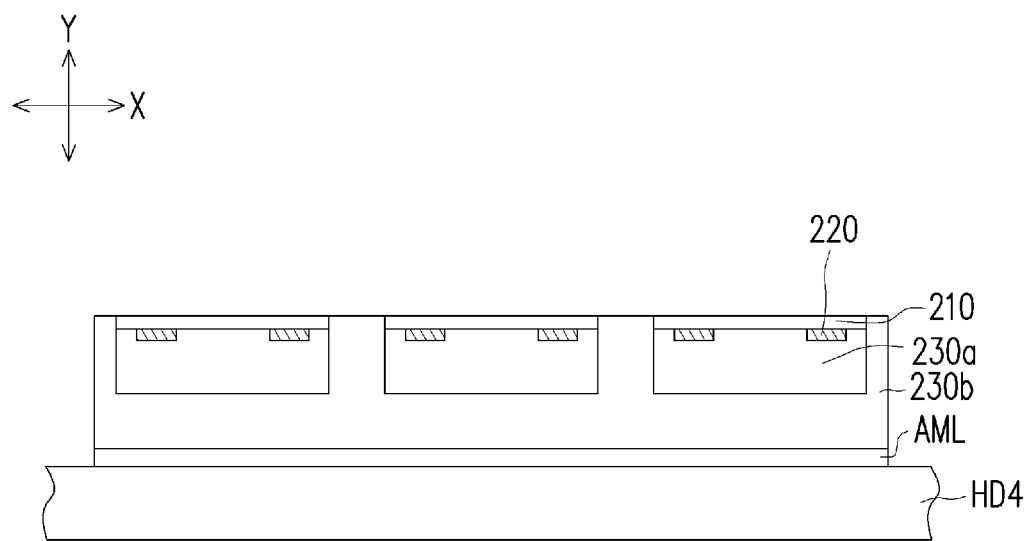
Figure 14E:
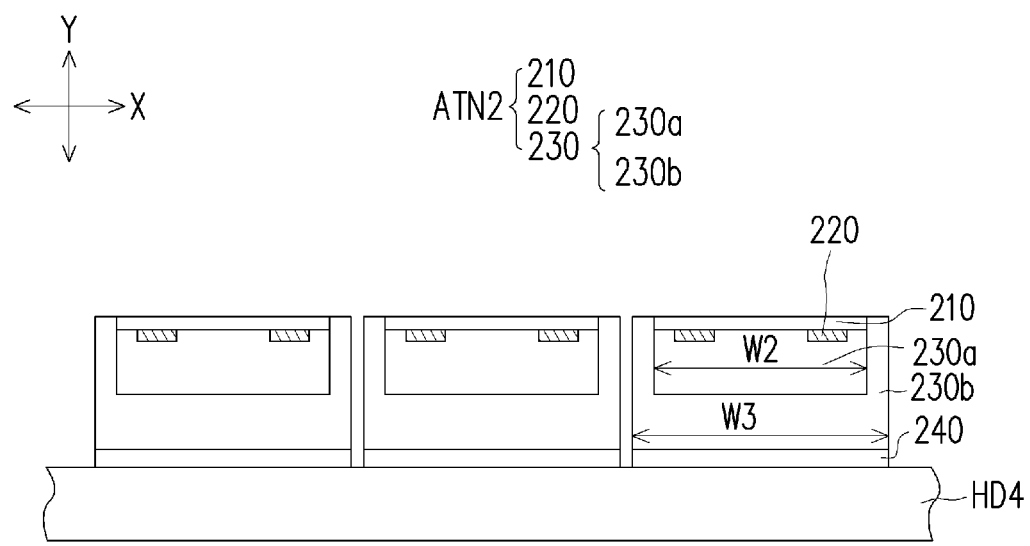
Figure 15A:
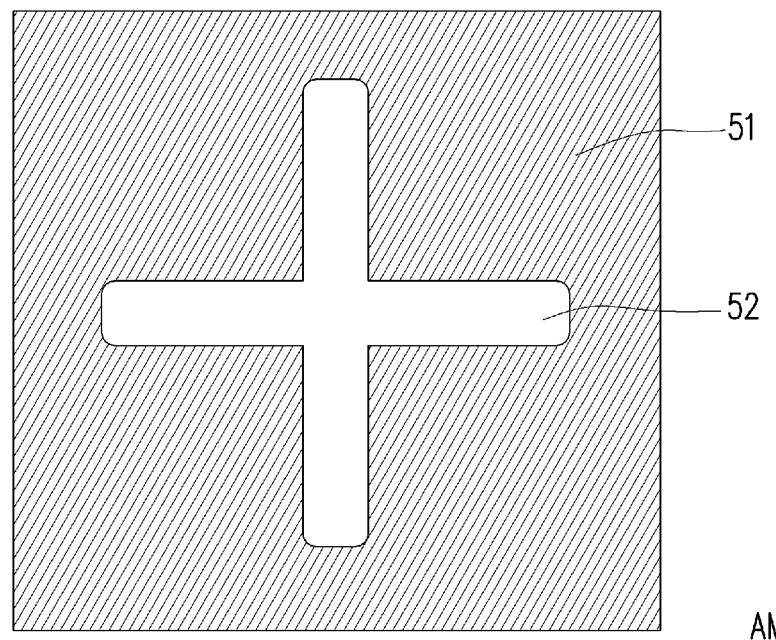
FIG. 15A to FIG. 15E are schematic top views illustrating various predetermined patterns of an alignment mark in accordance with some embodiments of the disclosure.
Figure 15B:
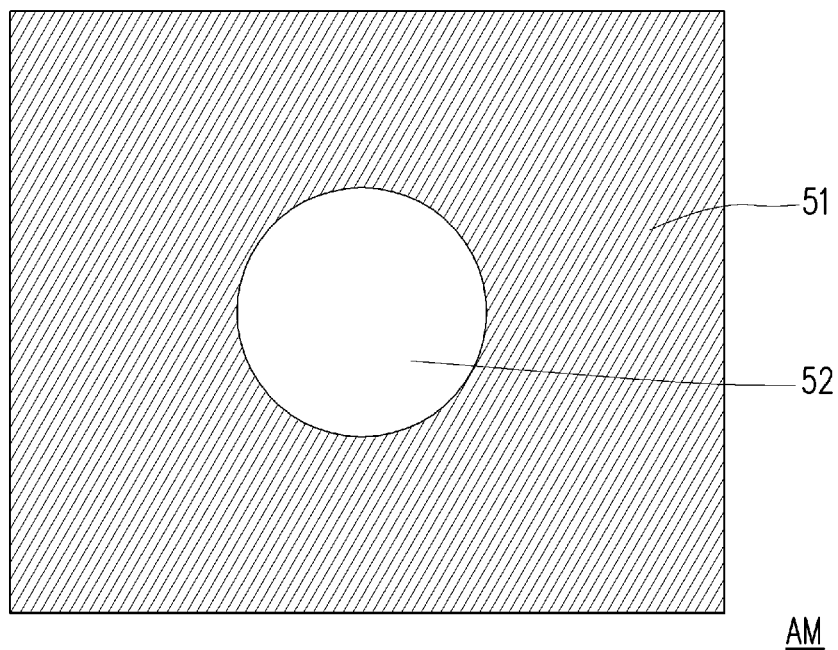
Figure 15C:
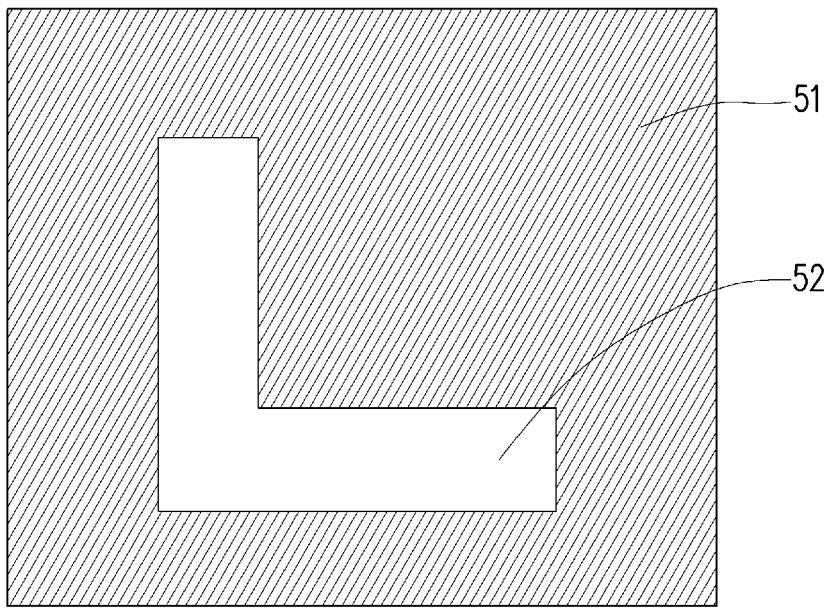
Figure 15D:
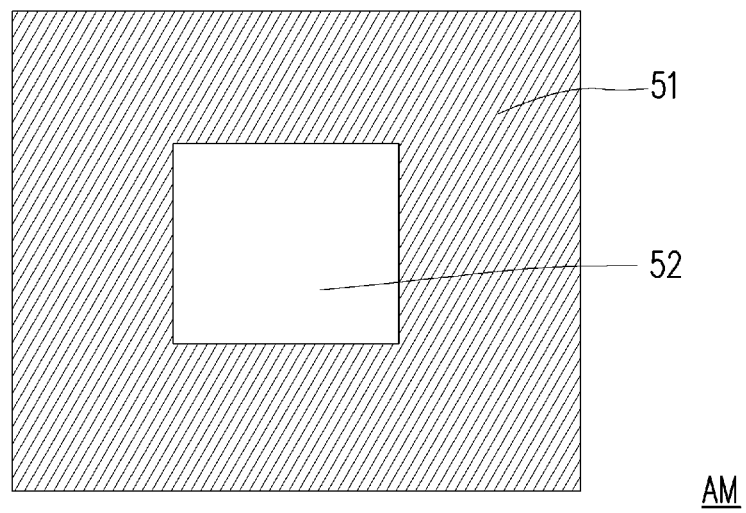
Figure 15E:
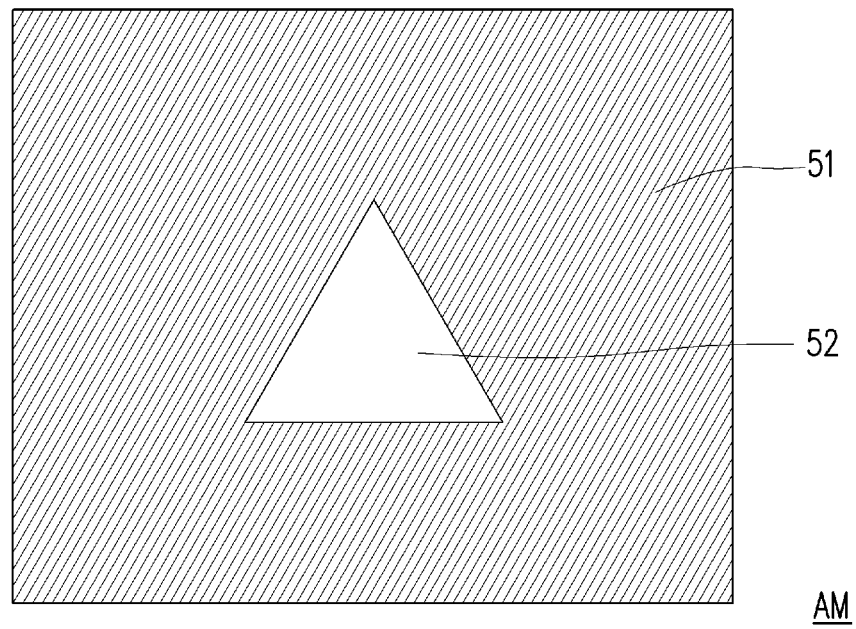

In some embodiments, the formation of the antenna package ATN2 may include the following steps illustrated in FIG. 14A to FIG. 14E, however the disclosure is not limited thereto. In FIG. 14A, a dielectric material layer IM is formed over a carrier C2 (similar to the carrier 112 depicted in FIG. 1) by lamination or the like, the metallic patterns 220 is formed on the dielectric material layer IM, and an insulating encapsulation material IEM1 is formed to encapsulate the metallic patterns 220 and at least partially cover the dielectric material layer IM. In FIG. 14B, the whole structure depicted in FIG. 14A is flipped (turned upside down) and placed onto a holding device HD3 (similar to the holding device HD1 depicted in FIG. 7), the carrier C2 is then deboned from the dielectric material layer IM, and the dielectric material layer IM and the insulating encapsulation material IEM1 are diced by mechanical sawing or the like to from the protection layer 210 and the insulating encapsulation 230a. In FIG. 14C, the whole structure depicted in FIG. 11B is flipped (turned upside down) and placed on a carrier C3 (similar to the carrier 112 depicted in FIG. 1), and an insulating encapsulation material IEM2 is formed to encapsulate the whole structure depicted in FIG. 11B, where the sum of the H2 of the insulating encapsulation 230a and the height H3 of the insulating encapsulation material IEM2 (where the height H3 is measured from a side Sa of the insulating encapsulation 230a to a side Sb of the insulating encapsulation material IEM2 as shown in FIG. 14C) is greater than or substantially equal to 1000 μm and less than or substantially equal to 1500 μm. In FIG. 14D, the whole structure depicted in FIG. 14C is flipped (turned upside down) and placed onto a holding device HD4 (similar to the holding device HD1 depicted in FIG. 7) provided with an adhesive material layer AML, and the carrier C3 is then deboned from the protection layer 210 and the insulating encapsulation 230a. In FIG. 14D, the insulating encapsulation material IEM2 and the adhesive material layer AML are diced by mechanical sawing or the like to respectively form the insulating encapsulation 230b and the connecting film 240, thereby forming a plurality of individual and separate antenna packages ATN2. Each of the antenna packages ATN2 is adhered to the connecting film 240 and includes the protection layer 210, the metallic patterns 220, and the insulating encapsulation 230 having the insulating encapsulation 230a and the insulating encapsulation 230b.

Figure 13:
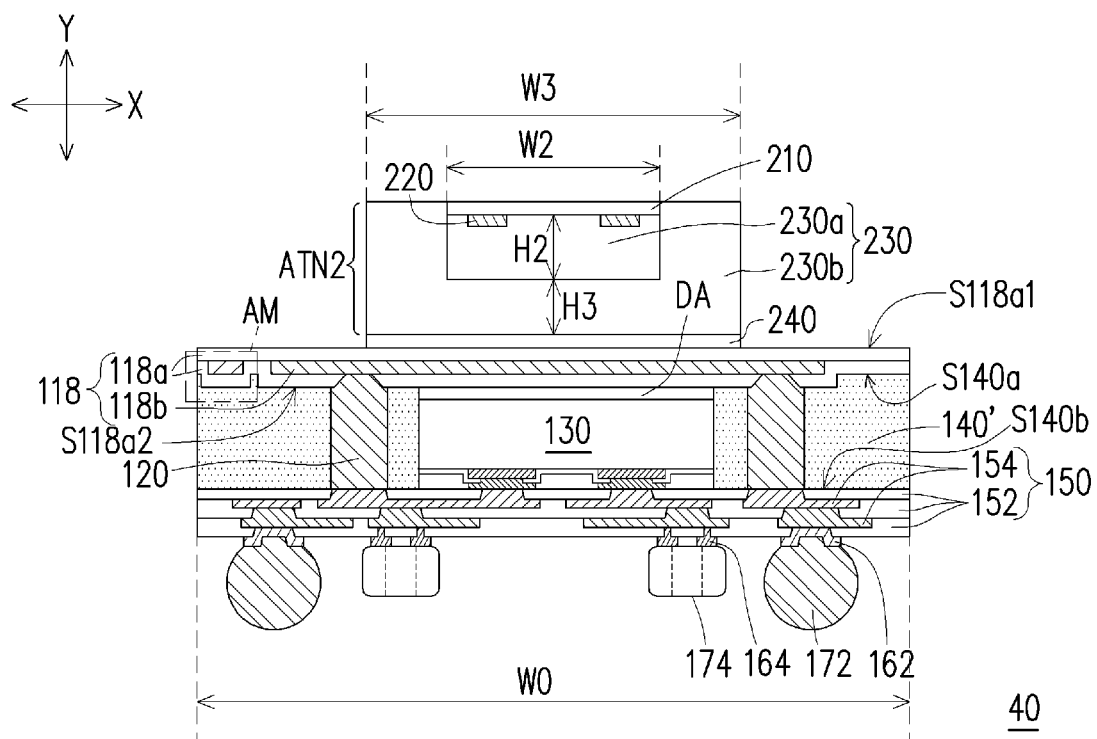
FIG. 13 is a schematic cross sectional view of a package structure in accordance with some embodiments of the disclosure.

FIG. 13 is a schematic cross sectional view of a package structure in accordance with some embodiments of the disclosure. Referring to FIG. 12 and FIG. 13, the package structure 30 depicted in FIG. 12 and the package structure 40 depicted in FIG. 13 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 12 and FIG. 13 together, the difference is that, for the antenna package ATN2 included the package structure 40 depicted in FIG. 13, the width W3 of the insulating encapsulation 230b is less than the width W0 of the chip package CP.

In some embodiments, as shown in FIG. 13, the width W2 of the insulating encapsulation 230a is less than the width W3 of the insulating encapsulation 230b, and the width W3 of the insulating encapsulation 230b is less than the width W0 of the chip package CP. As shown in FIG. 13, a sidewall of the antenna package ATN2 is distant from a sidewall of the chip package CP on the direction X, where the direction X is perpendicular to the direction Y (e.g. the stacking direction of the antenna package ATN2 and the chip package CP).

However, the disclosure is not limited thereto; in an alternative embodiment (not shown), the metallic patterns 220 are disposed on and distributed over the protection layer 210, the insulating encapsulation 230a encapsulates the metallic patterns 220 and covers the protection layer 210 exposed by the metallic patterns 220, and the insulating encapsulation 230b covers the side Sa of the insulating encapsulation 230a opposite to the protection layer 210, where the protection layer 210 is not in contact with the insulating encapsulation 230b and separated from the insulating encapsulation 230b through the insulating encapsulation 230a. In such embodiments, a sum of the height H2 of the insulating encapsulation 230a and the height H3 of the insulating encapsulation 230b (where the height H3 is measured from a side Sa of the insulating encapsulation 230a to a side Sb of insulating encapsulation 230b as shown in FIG. 14C) is greater than or substantially equal to 1000 μm and less than or substantially equal to 1500 m, the width W3 of the insulating encapsulation 230b is less than or substantially equal to the width W0 of the chip package CP, and the width W2 of the insulating encapsulation 230a is substantially equal to the width W3 of the insulating encapsulation 230b.

In accordance with some embodiments, a package structure includes a chip package and an antenna package. The chip package includes at least one semiconductor die and a first insulating encapsulation encapsulating the at least one semiconductor die. The antenna package is located on and electrically coupled to the chip package. The antenna package includes metallic patterns embedded in a second insulating encapsulation, wherein each of the metallic patterns has a first surface, a second surface opposite to the first surface and a side surface connecting the first surface and the second surface, wherein the first surface and the side surface of each of the metallic patterns are covered by the second insulating encapsulation, and the second surface is levelled and coplanar with a third surface of the second insulating encapsulation.

In accordance with some embodiments, a package structure includes a first redistribution circuit structure, at least one semiconductor die, a first insulating encapsulation, metallic patterns and a second insulating encapsulation. The at least one semiconductor die is located on and electrically connected to the first redistribution circuit structure. The first insulating encapsulation encapsulates the at least one semiconductor die. The metallic patterns are located on and electrically coupled to the first redistribution circuit structure. The second insulating encapsulation encapsulates the metallic patterns, wherein the first redistribution circuit structure is located between the first insulating encapsulation and the second insulating encapsulation. A sidewall of each of the metallic patterns is wrapped by the second insulating encapsulation, and a surface of each of the metallic patterns is exposed by a first side of the second insulating encapsulation.

In accordance with some embodiments, a manufacturing method of a package structure is provided with the following steps, forming an antenna package including forming metallic patterns on the insulating material layer, encapsulating metallic patterns in a first insulating encapsulation, and performing a dicing process to form the antenna package, wherein a sidewall of each of the metallic patterns is covered by the first insulating encapsulation; forming a first redistribution circuit structure; disposing at least one semiconductor die on the first redistribution circuit structure, wherein the at least one semiconductor die is electrically connected to the first redistribution circuit structure; encapsulating the at least one semiconductor die in a second insulating encapsulation; and disposing the antenna package on the first redistribution circuit structure, wherein the first redistribution circuit structure is electrically coupled to the antenna package and located between the at least one semiconductor die and the antenna package.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
    a chip package, comprising at least one semiconductor die, a first insulating encapsulation encapsulating the at least one semiconductor die and a first redistribution circuit structure, wherein the first redistribution circuit structure comprises at least one alignment mark; and
    an antenna package, located on and electrically coupled to the chip package, wherein the antenna package comprises:
        metallic patterns, embedded in a second insulating encapsulation, wherein each of the metallic patterns has a first surface, a second surface opposite to the first surface and a side surface connecting the first surface and the second surface, wherein the first surface and the side surface of each of the metallic patterns are entirely covered by the second insulating encapsulation, and the second surface is levelled and coplanar with a third surface of the second insulating encapsulation,
    wherein the first redistribution circuit structure is located between the antenna package and the first insulating encapsulation and electrically connected to the at least one semiconductor die.

2. The package structure of claim 1, wherein the second surface of each of the metallic patterns is accessibly revealed by the third surface of the second insulating encapsulation.

3. The package structure of claim 1, further comprising:
    a connecting film, located on a fourth surface of the second insulating encapsulation, wherein the third surface is opposite to the fourth surface, and the connecting film is located between the chip package and the antenna package.

4. The package structure of claim 3, wherein two opposite sides of the connecting film physically contact the second insulating encapsulation and the chip package, respectively.

5. The package structure of claim 1, wherein the at least one alignment mark comprises a predetermined pattern of a solid metal plate having at least one slit.

6. The package structure of claim 5, wherein a shape of the at least one slit comprises a L-shape, a cross-shape, a circular-shape, a triangular-shape, a rectangular shape, or combinations thereof.

7. The package structure of claim 1, wherein the chip package further comprises:
    a second redistribution circuit structure, located on the first insulating encapsulation and electrically connected to the at least one semiconductor die, wherein the first insulating encapsulation is located between the antenna package and the second redistribution circuit;
    through vias, penetrating the first insulating encapsulation and connecting to the first redistribution circuit structure and the second redistribution circuit structure; and
    conductive elements, located on and electrically connected to the second redistribution circuit structure, wherein the second redistribution circuit structure is located between the first insulating encapsulation and the conductive elements.

8. The package structure of claim 1, wherein a sidewall of the antenna package is aligned with a sidewall of the chip package along a stacking direction of the antenna package and the chip package.

9. The package structure of claim 1, wherein a sidewall of the antenna package is distant from a sidewall of the chip package on a direction perpendicular to a stacking direction of the antenna package and the chip package.

10. The package structure of claim 9, wherein a positioning location of the antenna package is within a positioning location of the chip package along a stacking direction of the antenna package and the chip package.

11. A package structure, comprising:
    a first redistribution circuit structure;

at least one semiconductor die, located on and electrically connected to the first redistribution circuit structure;

a first insulating encapsulation, encapsulating the at least one semiconductor die;

metallic patterns, located on and electrically coupled to the first redistribution circuit structure; and a second insulating encapsulation, encapsulating the metallic patterns, wherein the first redistribution circuit structure is located between the first insulating encapsulation and the second insulating encapsulation, wherein a sidewall of each of the metallic patterns is wrapped by the second insulating encapsulation, a first surface of each of the metallic patterns is entirely covered by the second insulating encapsulation, and a second surface of each of the metallic patterns is exposed by a first side of the second insulating encapsulation, wherein the first surface is opposite to the second surface along a stacking direction of the first insulating encapsulation and the second insulating encapsulation, and the first surface and the second surface are connected through the sidewall.

12. The package structure of claim 11, further comprising:
a third insulating encapsulation, located between the second insulating encapsulation and the first redistribution circuit structure, wherein a second side of the second insulating encapsulation is covered by the third insulating encapsulation.

13. The package structure of claim 12, wherein a third side of the second insulating encapsulation is covered by the third insulating encapsulation, and the third side of the second insulating encapsulation connects the first side and the second side.

14. The package structure of claim 11, wherein the first redistribution circuit structure comprises at least one alignment mark having a solid metal plate with at least one slit, and a shape of the at least one slit comprises a L-shape, a cross-shape, a circular-shape, a triangular-shape, a rectangular-shape, or combinations thereof.

15. The package structure of claim 11, further comprising:
a second redistribution circuit structure, located on the first insulating encapsulation and electrically connected to the at least one semiconductor die, wherein the first insulating encapsulation is located between the first redistribution circuit structure and the second redistribution circuit;

through vias, penetrating the first insulating encapsulation and connecting to the first redistribution circuit structure and the second redistribution circuit structure; and conductive elements, located on and electrically connected to the second redistribution circuit structure, wherein the second redistribution circuit structure is located between the first insulating encapsulation and the conductive elements.

16. The package structure of claim 11, wherein a sidewall of the second insulating encapsulation is aligned with a sidewall of the first insulating encapsulation along a stacking direction of the second insulating encapsulation and the first insulating encapsulation.

17. The package structure of claim 11, wherein a sidewall of the second insulating encapsulation is distant from a sidewall of the first insulating encapsulation on a direction perpendicular to a stacking direction of the second insulating encapsulation and the first insulating encapsulation.

* * * * *